United States Patent [19]
Ose et al.

[11] Patent Number: 5,095,208
[45] Date of Patent: Mar. 10, 1992

[54] CHARGED PARTICLE GENERATING DEVICE AND FOCUSING LENS THEREFOR

[75] Inventors: Yoichi Ose; Hiroki Sano; Yoshiya Higuchi, all of Hitachi; Kazuyoshi Miki, Katsuta, all of Japan

[73] Assignee: Hitachi, Ltd., Tokyo, Japan

[21] Appl. No.: 368,823

[22] Filed: Jun. 20, 1989

[30] Foreign Application Priority Data

Jun. 24, 1988 [JP] Japan .................... 63-154757

[51] Int. Cl.⁵ .......................... H01J 37/147
[52] U.S. Cl. .................. 250/329; 250/396 R; 313/361.1
[58] Field of Search ............ 250/309, 310, 396 R; 313/360.1, 361.1

[56] References Cited

U.S. PATENT DOCUMENTS

| | | | |
|---|---|---|---|
| 2,769,910 | 11/1956 | Elings | 313/361.1 |
| 3,920,990 | 11/1975 | Van Nieuwland et al. | 250/309 |
| 4,002,912 | 1/1977 | Johnson | 250/396 R |
| 4,107,526 | 8/1978 | McKinney et al. | 250/309 |
| 4,439,684 | 3/1984 | Hemmerich et al. | 250/396 R |
| 4,672,261 | 6/1987 | Shirai et al. | 313/414 |

*Primary Examiner*—Bruce C. Anderson
*Attorney, Agent, or Firm*—Antonelli, Terry, Stout & Kraus

[57] ABSTRACT

A charged particle generating device such as an ion implanter, a secondary ion mass spectrometer having a good mounting operability, a simple construction, good characteristics such as sensitivity, etc., owing to the fact that there is disposed a focusing electrode composed of the cylindrical electrodes disposed coaxially with each other, at least the inner electrode thereof having a plurality of openings.

24 Claims, 10 Drawing Sheets

CHARGED PARTICLE GENERATING DEVICE AND FOCUSING LENS THEREFOR

BACKGROUND OF THE INVENTION

This invention relates to a charged particle generating device used in an ion implanter, a quadrupole mass spectrometer, etc. and in particular to a charged particle generating device, which can be easily mounted and which has a simple construction or a high sensitivity, as well as a focusing lens suitable for focusing or accelerating or decelerating a charged particle beam therein.

An ion implanter, a quadrupole mass spectrometer, a secondary ion mass spectrometer, etc., can be cited as the charged particle generating apparatus. In these apparatuses a focusing lens is used for focusing or accelerating or decelerating charged particles such as ions, which are to be implanted in a semiconductor wafer, etc., ions generated by an object, which is to be analyzed, etc. As the focusing lens an electrostatic lens, in which parallel plane plate electrodes are combined to form a plurality of stages, as described in JP-A-59-40448 and JP-A-62-217549, is used widely. FIG. 15 is a cross-sectional view illustrating schematically a prior art electrostatic lens. Five electrodes 40, 41, 42, 43 and 44, which are parallel plane plates, each of which has a hole at the central portion, through which a beam passes, are combined. The electrodes 40, 42 and 44 are earthed and the electrodes 41 and 43 are connected with a power supply 33 so that a positive or negative high voltage is applied thereto. In this way a two-stage unipotential lens is formed. Further, in the quadrupole mass spectrometer described in JP-A-59-230246, there is disposed a decelerating zoom lens between an ion source and an analyzer, in which extracting electrodes are combined to form a plurality of stages, so as to obtain a low energy ion beam of several eV.

The prior art techniques described above have a good focusing property for a high quality beam such as a beam emitted by a point source, a parallel beam, etc., but for a beam having a great angular dispersion or a great energy dispersion emitted by a spread source the focusing property is restricted. In order to reduce spherical aberration produced by differences in positions for the purpose of obtaining a charged particle beam of high quality from a spread source according to the prior art techniques, it is necessary to increase the diameter of the holes, through which the beam passes, to a value several times as great as the diameter of the beam. In addition, in order to reduce chromatic aberration produced by differences in the energy of charged particles, it is necessary to increase the number of electrodes. However, in this case, there are problems that the electrode system becomes large and that high precision mounting is necessary in order to prevent worsening of the property due to decentering at the mounting. Furthermore, there are problems that mounting operability as a charged particle generating device is worsened, that the construction of the device itself is complicated, that the property as an analyzing apparatus is lowered, etc. Similar problems due to the necessary high precision mounting take place also in a radio frequency quadrupole accelerator.

SUMMARY OF THE INVENTION

A first object of this invention is to provide a charged particle generating device having a good mounting operability;

A second object of this invention is to provide a charged particle generating device having a simple structure;

A third object of this invention is to improve characteristics of the analyzing apparatus; and A fourth object of this invention is to provide a focusing lens capable of focusing a charged particle beam extracted from an ion source, which can be easily mounted.

The above objects can be achieved by disposing a focusing lens, in which cylindrical electrodes are mounted coaxially with each other, and at least the inner electrode has openings.

If a plurality of the openings described above are disposed in the peripheral and axial directions, an electric field penetrates into the interior of the inner electrode through the openings. By this penetrating electric field the charged particle beam is subjected successively to a focusing force, when it is traveling in the electrode. Even if the electrode is somewhat longer in the axial direction in order to reduce chromatic aberration (which corresponds to an increase of the number of electrodes according to the prior art techniques), since the outer and inner electrodes can be fabricated in one body, the construction is simple, the mounting operability is good, and worsening in property as a charged particle generating device due to positional deviations among the electrodes, which took place in a prior art electrostatic lens, is removed.

DESCRIPTION OF THE PREFERRED EMBODIMENTS

Figure 1:
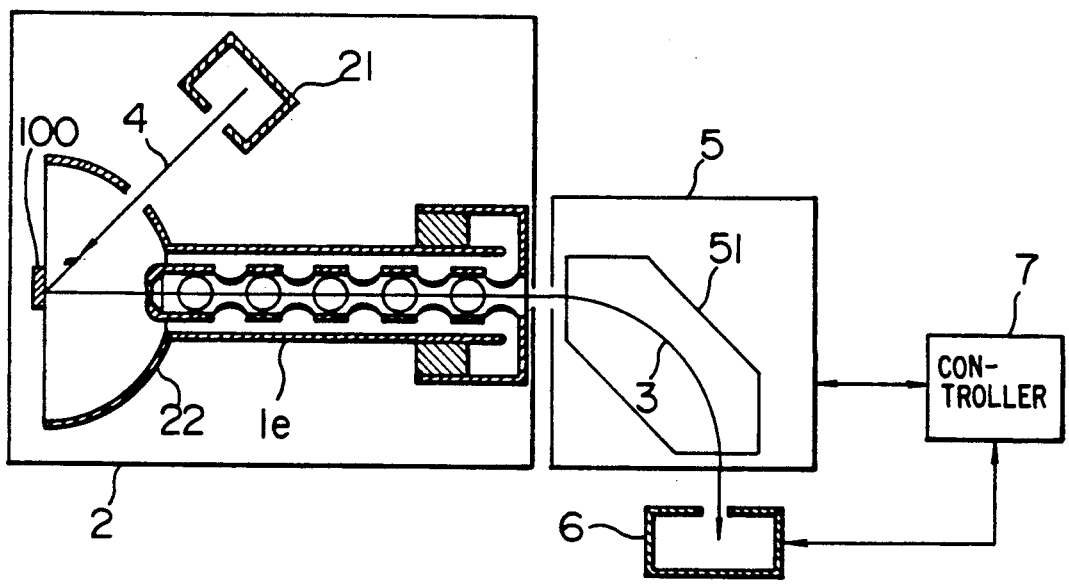
FIG. 1 is a schematic view illustrating an embodiment of this invention, in the case where the charged particle generating device is a secondary ion mass spectrometer.

Hereinbelow some preferred embodiments of this invention will be explained, referring to the drawings.

Figure 2:
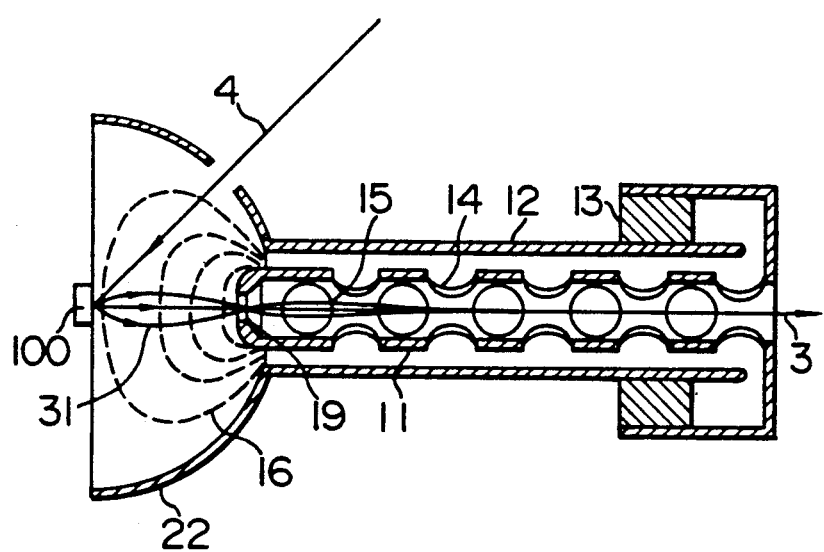
FIG. 2 is cross-sectional view showing the construction of a shield electrode and an extracting and focusing lens in detail.

An embodiment of this invention, in the case where the charged particle generating device is a secondary ion mass spectrometer, will be explained, referring to FIGS. 1-2, 3A-3B, 4, 5A-5B, 6-9, and 10A-10B. FIG. 1 shows a secondary ion mass spectrometer according to this invention. The secondary ion mass spectrometer basically consists of an ion source 2, a selector 5, a detector 6 and a controller 7. The ion source 2 consists of a primary ion irradiator 21, a shield electrode 22 and an extracting focusing lens le representing a realization form of the focusing lens which is a feature of this invention. FIG. 2 shows the construction of the shield electrode 22 and the extracting focusing lens le in detail. The extracting focusing lens le comprises an inner electrode 11 and an outer electrode 12, to which predetermined potentials are applied. The external electrode 12 is connected electrically and physically with the shield electrode 22. Openings 14, 15, are formed in the inner electrode 11, while varying their angular position by 90° with respect to directly preceding openings in the axial direction. The inner electrode 11 is secured to the outer electrode 12 through an insulator 13.

Now the operation of this embodiment will be explained. When a sample 100 to be examined is irradiated with a primary ion beam 4 emitted by the primary ion irradiator 21, secondary ions 31 are emitted therefrom, depending on the composition of the sample. The secondary ions 31 are extracted to an injection aperture 19 by an extracting potential distribution 16 formed by the extracting focusing lens 1e and subjected to the focusing action of the electric field generated within the inner electrode to form a secondary ion beam 3. The secondary ion beam 3 enters the selector 5, in which it is deflected, depending on the strength B of the magnetic field produced by a separating magnet 51, so that only the ions having a mass corresponding to the strength B of the magnetic field are injected into the detector 6. That is, since it is possible to vary the mass of the ions injected into the detector by varying the strength B of the magnetic field produced by the magnet 51, mass analysis is effected by means of the secondary ion mass spectrometer by varying slowly the strength B of the magnetic field produced by the separating magnet 51 by means of the controller 7 to know the amount of the relevant mass by using the amount of ion current detected by the detector 6 at that time.

Figure 3A:
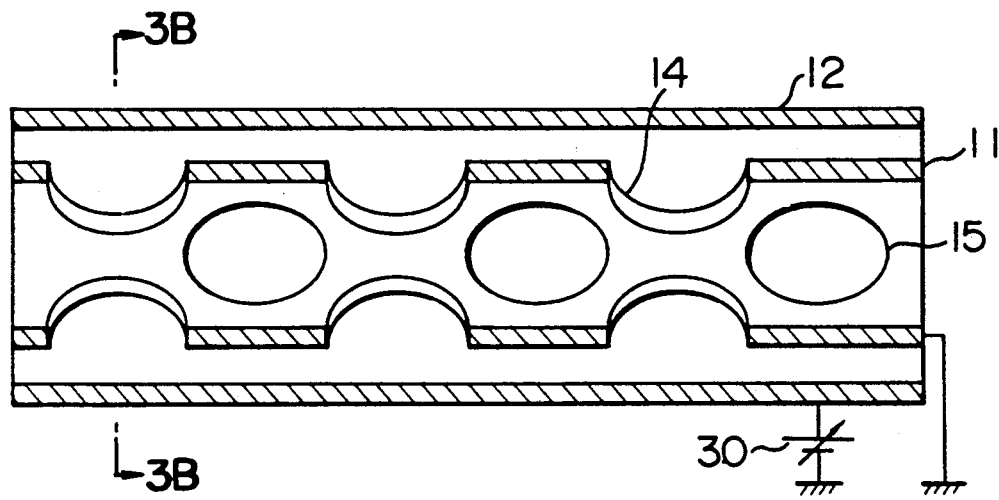
FIG. 3A is a longitudinal cross-sectional view of a first embodiment of the focusing lens.
Figure 3B:
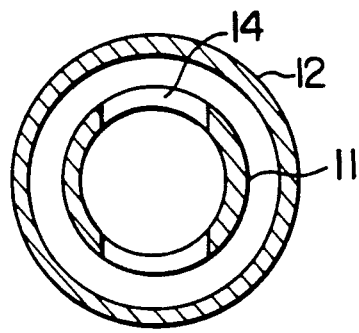
FIG. 3B is a transversal cross-sectional view of the same embodiment.

Next the action of the focusing lens, which is the feature of this invention, will be explained. FIGS. 3A and 3B show a first embodiment of the focusing lens, for which only the structure exerting the focusing action of the extracting focusing lens le is shown. FIGS. 3A and 3B are a longitudinal and a transversal cross-sectional view of a lens system constructed by a double cylindrical electrode consisting of two coaxial cylinders, respectively. The inner electrode 11 and the outer electrode 12 are insulated electrically from each other. As described above, a plurality of openings 14, 15 are formed in the inner electrode 11 in the axial direction as well as in the peripheral direction. When the external electrode 12 is connected with a power supply 30 so as to produce a potential difference with respect to the inner electrode 11, the electric field penetrates into the interior of the inner electrode 11 through the openings 14, 15.

Figure 4:
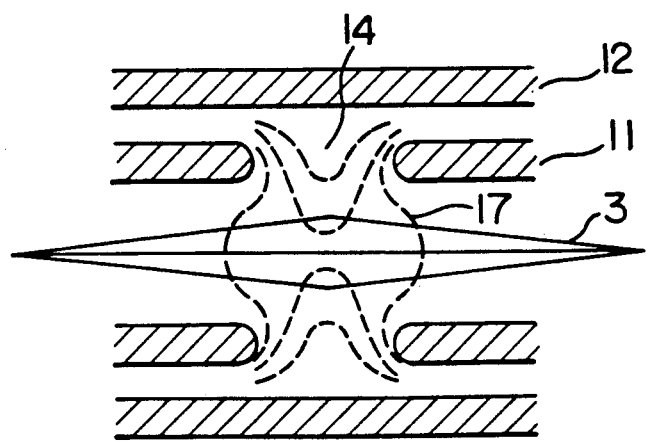
FIG. 4 is a schematic view for explaining the focusing action of the focusing lens of this invention.

FIG. 4 is a longitudinal cross-sectional view of a part of the focusing lens for explaining the focusing action of the electric field penetrating into the inner electrode 11. The electric field penetrating through the opening 14 is distributed as indicated by equipotential contour lines 17 and forms thus a quadrupole lens, which focuses the ion beam 3 on the axis.

Figure 5:
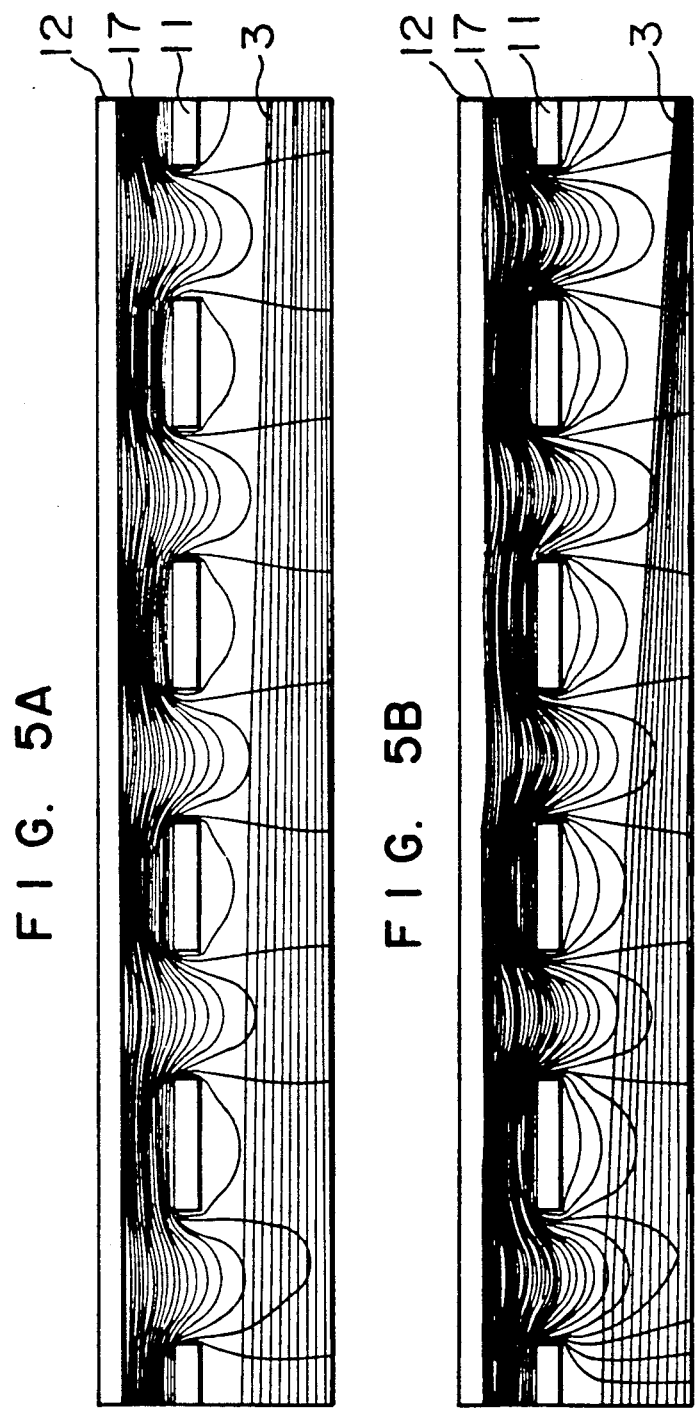
FIGS. 5A and 5B show simulation results of the focusing action of the focusing lens of this invention.

FIGS. 5A and 5B show results of ion beam trajectory simulation, in the case where openings are disposed in 5 steps along the axis. It is supposed that ions injected from the left end are positively charged and have an initial energy of 2KeV. The inner electrode 11 is grounded and to the outer electrode 12 is applied 1KV in FIG. 5A and 2KV in FIG. 5B. It can be seen that the ion beam 3 is focused approximately uniformly in the axial direction.

The region, from which secondary ions are emitted, explained referring to FIG. 2, is about several hundred micrometers long. To the contrary, the angular distribution at the exit can be represented by a COS distribution and the initial energy is extended from 0 to several ten eV. For this reason, when the beam is focused by means of a one stage unipotential lens, chromatic aberration and spherical aberration are great and the rate of yield is remarkably worsened. Contrarily thereto, when it is focused by means of a focusing lens according to this invention, even if dispersion in angle and energy is great, secondary ions can be focused satisfactorily and thus it is possible to increase the amount of secondary ions injected into the selector 5. As the result, sensitivity, i.e. the performance of the secondary ion mass spectrometer can be improved. Further, since a number of lenses can be formed by using a small number of electrodes, the construction of the focusing lens is simplified. Still further, since the inner electrode and the outer electrode can be fabricated in one body, the mounting operability in the secondary ion mass spectrometer is improved.

Figure 6:
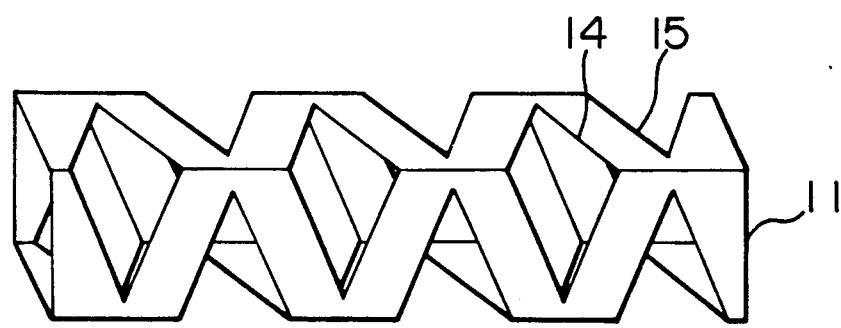
FIG. 6 is a perspective view of a second embodiment of the focusing lens.

FIG. 6 illustrates a second embodiment of the focusing lens according to this invention. There exist an outer and an inner electrode, between which a potential difference is given, and the inner electrode 11 is fabricated, starting from a square tube. The electrode 11 is made usually of stainless steel, copper, aluminium, etc. However, in the case where it is presumed that the beam collides therewith, tantalum or tungsten, which is a high melting point metal, is used therefor. Openings 14, 15 are formed such that they are symmetric to respect with the axis and displaced by 90° with respect to directly preceding openings in the axial direction. The area of the openings can be varied by regulating the depth of the cutting. In this embodiment also an effect similar to that obtained in the first embodiment of the focusing lens according to this invention can be obtained.

Figure 7:
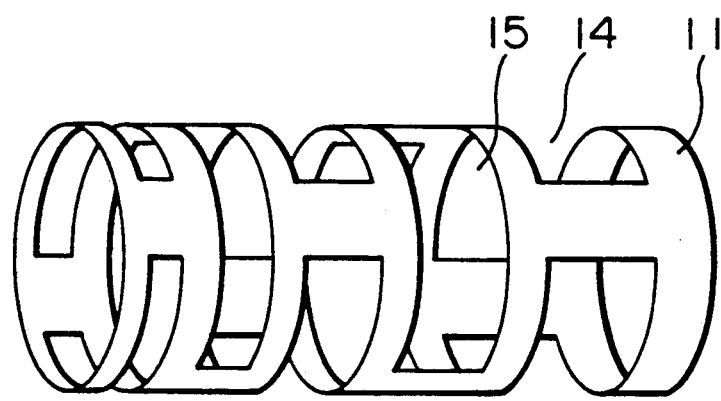
FIG. 7 is a perspective view of a third embodiment of the focusing lens.

FIG. 7 is a perspective view illustrating a third embodiment of the focusing lens according to this invention. In a cylindrical inner electrode 11 disposed within an outer electrode, between which a potential difference is provided, openings 14, 15, which are rectangular in the developed plane of the inner electrode 11, are formed. These openings are angularly displaced by 90° one after another with respect to directly preceding openings in the axial direction and the area of the openings increases in the traveling direction of the charged particle beam. This is for the purpose of making the electric field to the neighborhood of the center axis, because the beam is focused more closely to the center axis as the beam advances. As the result it is possible to improve the property to focus the charged particle beam.

Figure 8:
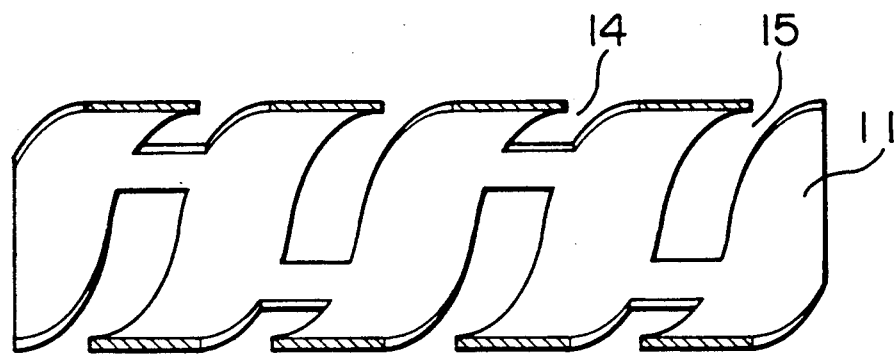
FIG. 8 is a perspective view of a fourth embodiment of the focusing lens.

FIG. 8 is a longitudinal cross-sectional view illustrating a fourth embodiment of the focusing lens according to this invention. In an inner electrode 11 disposed within an outer electrode, between which a potential difference is provided, openings 14, 15 are formed spirally. Since the openings 14 and 15 are displaced by 90° from each other in the peripheral direction, there exists always an opening at the symmetric position of another opening with respect to the axis. Since the focusing direction of the beam rotates as the beam advances, it is possible to obtain a focused beam having a circular uniform cross-section.

Figure 9:
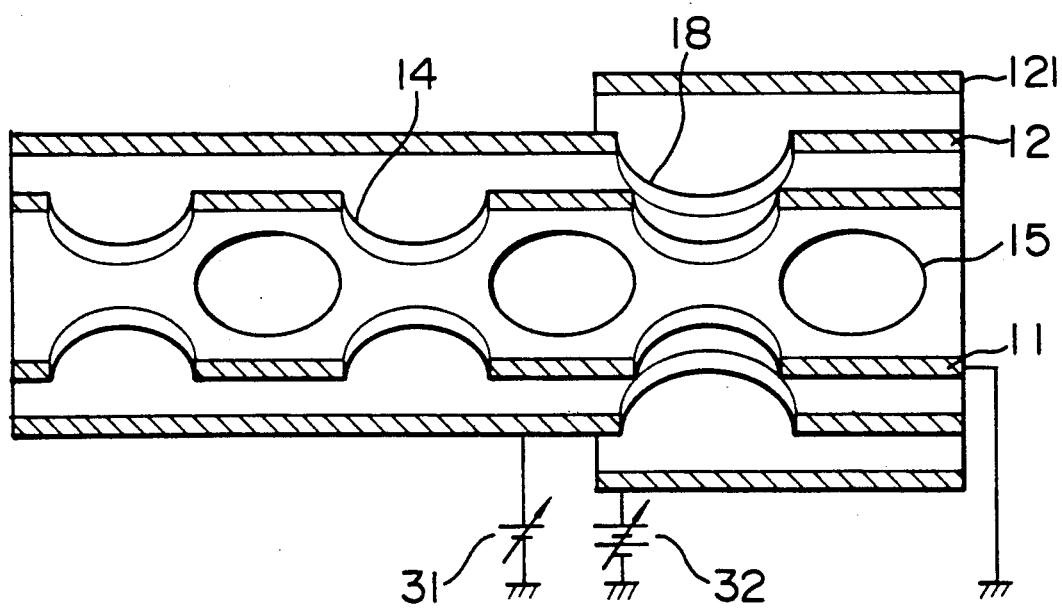
FIG. 9 is a longitudinal cross-sectional view of a fifth embodiment of the focusing lens.

FIG. 9 is a longitudinal cross-sectional view of a fifth embodiment of the focusing lens according to this invention. The outer electrode surrounding coaxially an inner electrode 11, in which openings 14, 15 are formed, while varying their angular position by 90° with respect to directly preceding openings in the axial direction, consists of a plurality of electrodes 12 and 121. The electrodes 11, 12 and 121 are insulated electrically from each other. The inner electrode 11 is grounded. The outer electrodes 12 and 121 are connected with power supplies 31 and 32, respectively. Choosing selected openings among the openings 14, 15 formed in the inner electrode 11, openings 18 are formed in the outer electrode 12 outside thereof so as to be opposite thereto. By regulating the voltage applied to the outer electrode 121, it is possible to regulate the electric field penetrating into the inner electrode 11. Although, in this embodiment, the outer electrode 12 is surrounded by the cylindrical outer electrode 121, plane plate electrodes having an area approximately equal to that of the opening 18 may be disposed on the outer side of the openings 18.

Although, in many of the focusing lenses described above, the openings 14, 15 formed in the inner electrode 11 are disposed, while varying their angular position by 90° with respect to directly preceding openings in the axial direction, they may be disposed not always while varying their angular position by 90°. In the case where their angular position is displaced by 90°, this corresponds to the fact that a quadrupole lens is constructed.

Figure 10A:
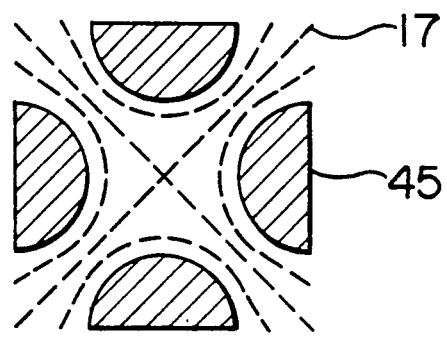
FIGS. 10A and 10B are schematic views for explaining the action of a prior art quadrupole lens and a quadrupole lens which is a focusing lens of this invention, respectively.
Figure 10B:
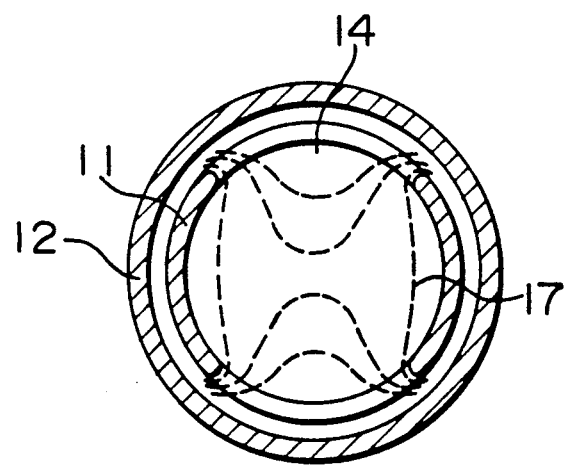

FIGS. 10A and 10B are transversal cross-sectional views of a prior art quadrupole lens and a quadrupole lens composed of the electrodes according to this invention, respectively. A quadrupole electrode 45 is paired with a quadrupole, which is opposite thereto, and a saddle-shaped potential distribution 17 is formed by applying a voltage thereto. Since, for this reason, a single quadrupole lens has a focusing action only in one direction, which is perpendicular to the flight direction of the beam, it is possible to realize focusing in two directions by superposing quadrupole lenses by varying their angular position by 90° with respect to directly preceding in the axial direction.

It is possible also to accelerate a charged particle beam by forming the quadrupole electrode 45 indicated in FIG. 10A in an undulatory form and applying a radio frequency voltage thereto. In the case indicated in FIG. 10B according to this invention also, it is possible to accelerate a charged particle beam by applying a radio frequency voltage thereto.

Figure 11:
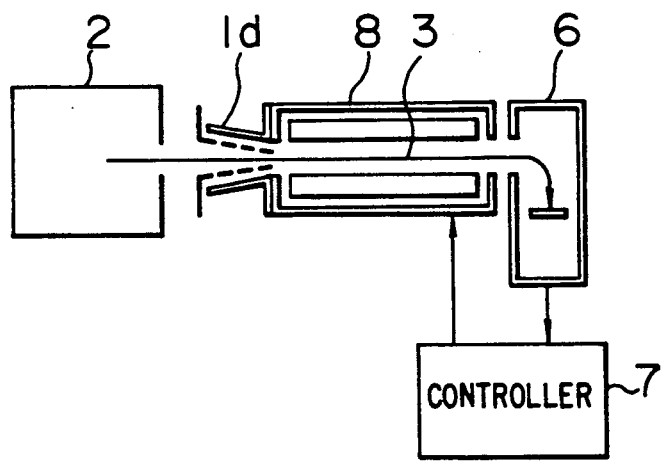
FIG. 11 is a schematic view illustrating another embodiment of this invention, in the case where the charged particle generating device is a guadrupole mass spectrometer.

An embodiment of this invention, in the case where the charged particle generating device is a quadrupole mass spectrometer, will be explained, referring to FIGS. 11 and 12. FIG. 11 shows the quadrupole mass spectrometer, which is an embodiment of this invention. The quadrupole mass spectrometer is composed of the ion source 2 indicated in FIG. 1, a decelerating focusing lens 1d, a quadrupole mass analyzer 8, a detector 6 and a controller 7. Secondary ions produced by the ion source 2 form a secondary ion beam 3, which is once accelerated to several hundred eV to several keV by an extracting focusing lens 1e in the ion source 2 (see FIG. 1) used for accelerating ions. The secondary ion beam 3 injected into a decelerating focusing lens 1d at several hundred ev to several keV is decelerated to several ten eV and at the same time focused in the decelerating focusing lens 1d to form a narrow beam, whose diameter is smaller than 1 mm, which is injected into the quadrupole mass analyzer 8 having a structure similar to that of the quadrupole lens. A high frequency electric field is applied to the quadrupole mass analyzer so that only ions having a mass selected by this radio frequency in the injected secondary ion beam 3 are injected into the detector 6. At that time it is possible to select a mass by varying the frequency of the radio frequency electric field applied to the quadrupole mass analyzer 8 by means of the controller 7 and to detect the amount thereof by measuring the current flowing through the detector.

Figure 12:
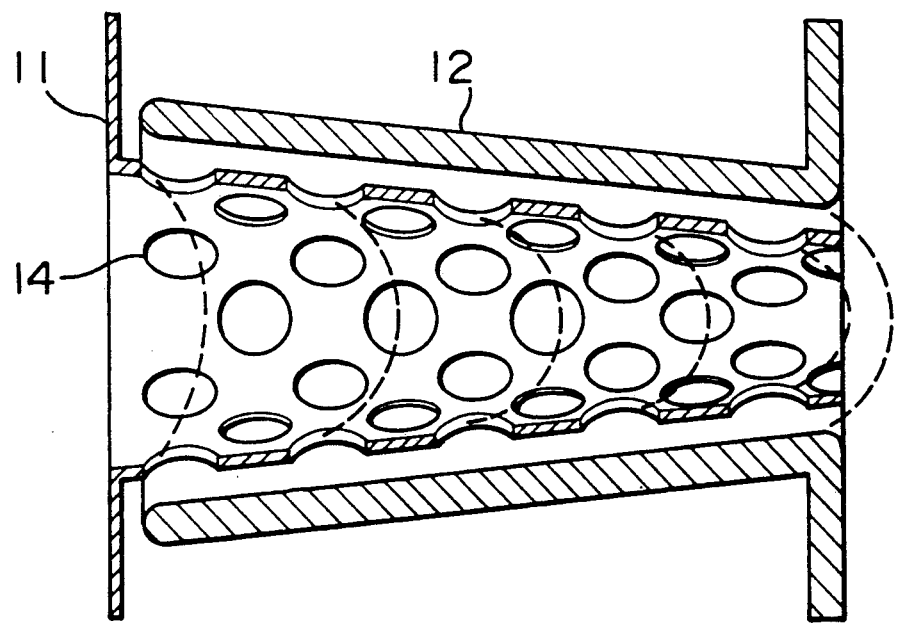
FIG. 12 is a cross-sectional view illustrating a decelerating focusing lens, which is another embodiment of this invention.

FIG. 12 illustrates an embodiment of the decelerating focusing lens. A number of openings 14 are formed in the inner electrode 11. The inner electrode 11 and the outer electrode 12, between which a potential difference is provided, become narrower in the beam traveling direction. As the result, since the electric field is produced closer to the axis as the beam travels towards the quadrupole mass analyzer, equipotential contour lines indicated by broken lines in FIG. 12 are formed. Consequently an electric field, which decelerates the beam while focusing it along the beam traveling direction, is formed by applying a voltage for decelerating the beam to the outer electrode 12. As another embodiment of the decelerating focusing lens, it can be realized also by varying gradually the area of the openings, as indicated in FIG. 7. Consequently, by using this decelerating focusing lens, it is possible to obtain a focused beam having a low energy and a small angular dispersion, which are necessary for increasing the sensitivity and the resolution of the quadrupole mass analyzer. In this embodiment also the effect on the mounting operability to the apparatus, etc. can be obtained similarly to the case of the secondary ion mass spectrometer.

Figure 13:
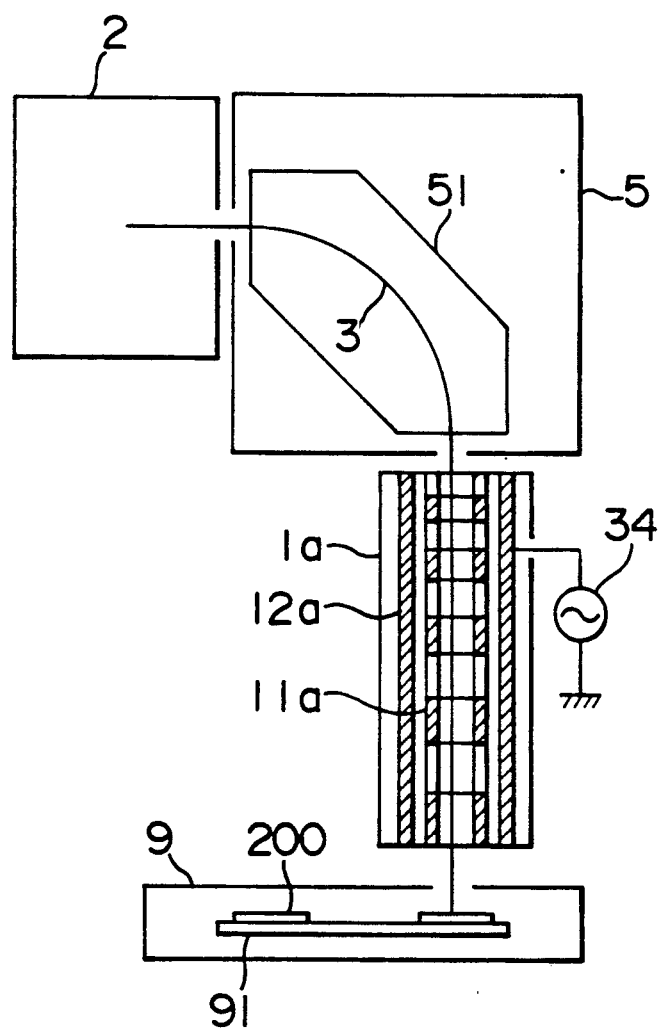
FIG. 13 is a schematic view illustrating still another embodiment of this invention, in the case where the charged particle generating device is an ion implanter.

An embodiment of this invention, in the case where the charged particle generating device is an ion implanter will be explained, referring to FIGS. 13, 14A and 14B. FIG. 13 illustrates a high energy ion implanter for a semiconductor, which is an embodiment of this invention. This ion implanter is composed of an ion source 2 as shown in FIG. 1, a selector 5, an accelerating focusing lens 1a and an ion implantation chamber 9. The operation of the ion source 2 and the selector 5 is identical to that explained, referring to FIG. 1. The secondary ion beam 3 emitted by the selector 5 is accelerated by the accelerating focusing lens 1a and accelerated ions are implanted in a semiconductor wafer 200 located on a rotating disk 91 in the ion implanting chamber 9. The ion implanter having this construction has a merit that problems of insulation and electric shock are avoided, etc., because the ion source 2, the selector 5, the accelerating focusing lens 1a and the ion implanting chamber 9 can be held at the ground potential.

Figure 14A:
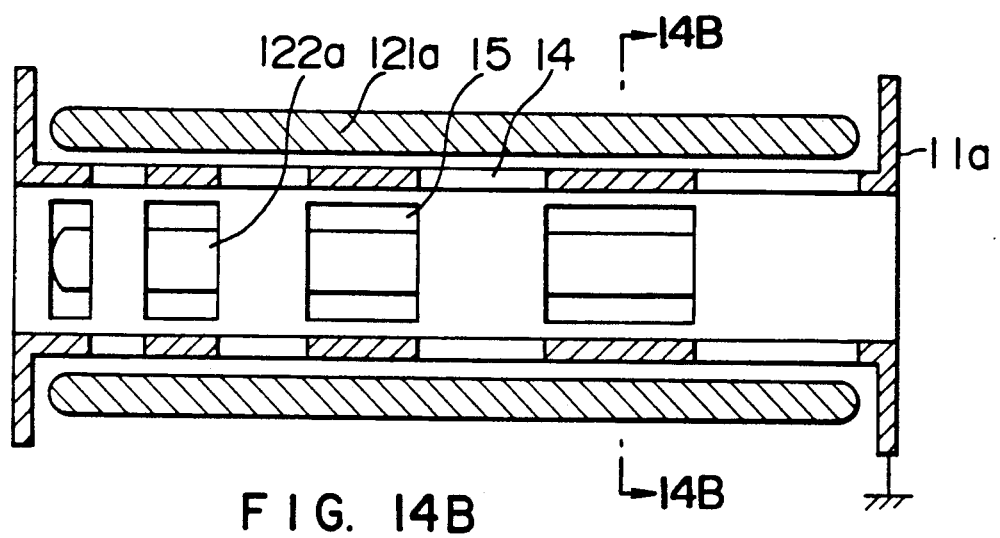
FIG. 14A is a longitudinal cross-sectional view of an accelerating focusing lens, which is still another embodiment of this invention.
Figure 14B:
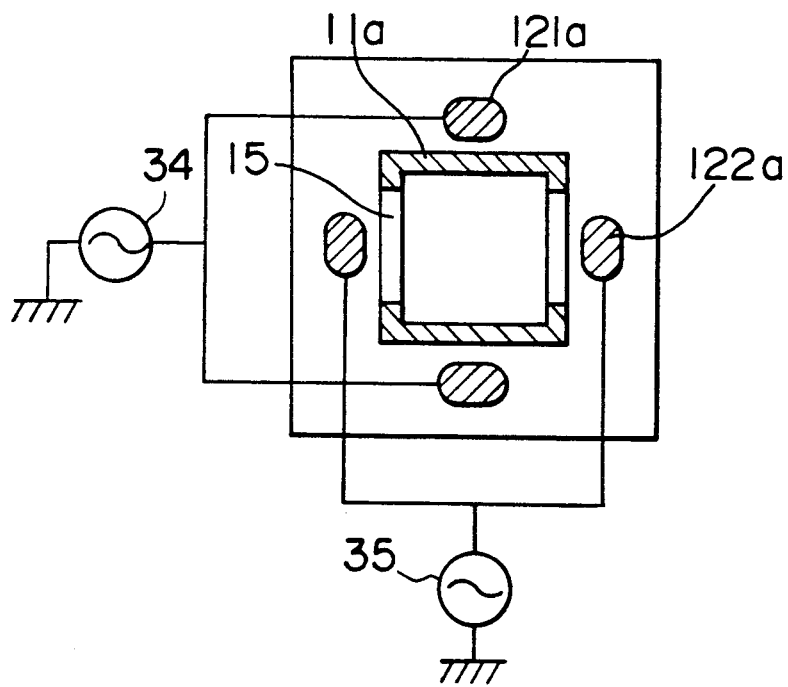
FIG. 14B is a transversal cross-sectional view of the same accelerating focusing lens.
Figure 15:
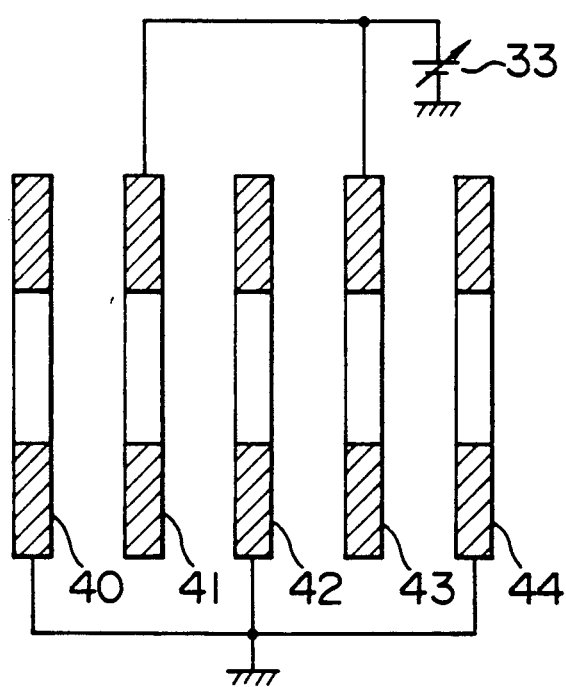
FIG. 15 shows a prior art focusing lens.

FIGS. 14A and 14B show an embodiment of the accelerating focusing lens 1a according to this invention. FIGS. 14A and 14B are a longitudinal and a transversal cross-sectional view thereof. An inner electrode 11a is fabricated, starting from a square tube. Rectangular openings 14 and 15 are formed in two pairs of surfaces opposite to each other, respectively. Outside of each of the surfaces there is disposed a bar-shaped outer electrode 121a, 122a, which is quadrupole-electrode-like. Those outer electrodes that oppose those of the respective openings that are located at same positions in the axial (longitudinal) direction are connected to a respective same or common radio frequency power source 34 or 35. The radio frequency voltage of this radio frequency power source is applied with such a phase that the ions are accelerated, as if they were riding a wave crest, when the secondary ion beam 3 is injected into the accelerating focusing lens. Further, in order that the time of flight between two adjacent openings is kept to be constant, the interval L between two adjacent openings formed in the inner electrode is given by;

$$L = v/f \qquad (1)$$

where v represents the velocity of the charged particles and f indicates the frequency of the radio frequency voltage 34 or 35. By means of this accelerating focusing lens it is possible to accelerate the charged particle beam injected at the left end.

This accelerating focusing lens consists of five parts and an effect can be obtained that the mounting is easy and the construction of the ion implanter is simplified.

As explained above, effects described below can be obtained by forming the electrodes in a tube shape, and disposing them coaxially with each other, for a focusing lens used in a charged particle generating device, at least the inner electrode having openings.

Since the inner electrode and the outer electrode can be fabricated in one body, it is possible to provide a charged particle generating device having a good mounting operability.

Further, since a lens, which was composed of a number of electrodes according to the prior art techniques, can be fabricated with a small number of electrodes, it is possible to provide a charged particle generating device having a simple construction.

Still further the ratio of utilization of the ion beam is high and as a result it is possible to improve the performance of the analyzing apparatus and in particular the sensitivity thereof.

Still further it is possible to provide a charged particle generating device, in which the performance thereof is not worsened by displacement of the electrodes, as is the case in the prior art devices.

Finally it is possible to provide a focusing lens, by which it is possible to focus a charged particle beam extracted from an ion source with a low aberration and the mounting operation is easy.

What is claimed is:

1. A charged particle generating device comprising: means for producing charged particles; and
a focusing electrode for focusing said charged particles composed of cylindrical electrodes disposed coaxially with each other, at least the inner electrode thereof having a plurality of openings;
wherein said focusing lens has a plurality of openings, the pitch of which varies along the axial direction of said cylinders.

2. A device comprising:
a focusing lens composed of cylindrical electrodes disposed coaxially with each other, at least the inner electrode having a plurality of openings which produces an electric field penetrating through said openings so as to accelerate ions as they advance towards the exit for ions;
wherein there is disposed a focusing lens, which accelerates ions by applying a radio frequency voltage to the outer electrode.

3. A device for accelerating ions by means of a focusing lens, the focusing lens comprising:
a cylindrical inner electrode having openings disposed with predetermined intervals in the peripheral direction as well as in the axial direction;
outer electrodes disposed opposite to said openings of said inner electrode; and
means for applying a radio frequency voltage in a same phase to those of said outer electrodes that oppose those of said openings that are disposed at same intervals in the axial direction.

4. A device according to claim 3, wherein the outer electrodes are bar-shaped electrodes extending in the axial direction.

5. A focusing lens comprising:
a hollow inner electrode having a longitudinal axis;
an outer electrode disposed outside of said inner electrode; and
means for applying predetermined potentials to said inner and outer electrodes;
said inner electrode having openings formed therein through which an electric field penetrates, said openings being equidistant from said longitudinal axis of said inner electrode.

6. A charged particle generating device comprising: means for producing charged particles; and
focusing means for focusing the charged particles, the focusing means comprising:
a plurality of cylindrical electrodes disposed coaxially with each other, an innermost one of the electrodes having openings distributed in an axial direction of the innermost electrode, the charged particles being directed into an interior of the innermost electrode in the axial direction thereof; and
means for generating an electric field outside the innermost electrode;
wherein the electric field penetrates through the openings in the innermost electrode into the interior of the innermost electrode so as to focus the charged particles therein in the axial direction of the innermost electrode.

7. A charged particle generating device according to claim 6, wherein the openings in the innermost electrode are further distributed in a circumferential direction of the innermost electrode.

8. A charged particle generating device according to claim 6, wherein the openings in the innermost electrode comprise pairs of openings, the openings of each pair being symmetrically disposed with respect to an axis of the innermost electrode.

9. A charged particle generating device according to claim 6, wherein the openings in the innermost electrode have respective areas which vary in the axial direction of the innermost electrode.

10. A charged particle generating device according to claim 6, wherein the openings are distributed in the axial direction of the innermost electrode at a pitch which varies in the axial direction of the innermost electrode.

11. A charged particle generating device according to claim 6, wherein said charged particle generating device is a secondary ion mass spectrometer.

12. A charged particle generating device according to claim 6, wherein said charged particle generating device is a quadrupole mass spectrometer.

13. A charged particle generating device according to claim 6, wherein said charged particle generating device is an ion implanter.

14. A secondary ion mass spectrometer comprising:
means for producing primary ions and for irradiating a sample with the primary ions so as to cause the sample to emit secondary ions; and
extracting focusing means for extracting and focusing the secondary ions, the extracting focusing means comprising:
two cylindrical electrodes disposed coaxially with each other, an inner one of the electrodes having openings, the secondary ions being directed into an interior of the inner electrode in the axial direction thereof; and
means for generating an electric field between the two electrodes;
wherein the electric field penetrates through the openings in the inner electrode into the interior of the inner electrode so as to focus the secondary ions therein in the axial direction of the inner electrode;
the secondary ion mass spectrometer further comprising:
means for selecting ones of the focused secondary ions having a selected mass; and
means for detecting the selected secondary ions.

15. A secondary ion mass spectrometer comprising:
means for irradiating a sample with charged particles so as to cause the sample to emit secondary ions; and
extracting focusing means for extracting and focusing the secondary ions, the extracting focusing means comprising:
a plurality of cylindrical electrodes disposed coaxially with each other, an innermost one of the electrodes having openings distributed in an axial direction of the innermost electrode, the secondary ions being directed into an interior of the innermost electrode in the axial direction thereof; and
means for generating an electric field outside the innermost electrode;
wherein the electric field penetrates through the openings in the innermost electrode into the interior of the innermost electrode so as to form a focusing lens therein for focusing the secondary ions in the interior of the innermost electrode in the axial direction of the innermost electrode.

16. An apparatus comprising:
focusing means for focusing ions, the focusing means comprising:
two cylindrical electrodes disposed coaxially with each other, an inner one of the electrodes having openings distributed in an axial direction of the inner electrode, the ions being directed into an interior of the inner electrode in the axial direction thereof; and
means for generating an electric field between the two electrodes;
wherein the electric field penetrates through the openings in the inner electrode into the interior of the inner electrode so as to form a deceleration electric field in the interior of the inner electrode for decelerating the ions therein in the axial direction of the inner electrode;
the apparatus further comprising:
means for selecting ones of the focused ions having a selected mass; and
means for detecting the selected ions.

17. An apparatus according to claim 16, wherein the two electrodes have cross-sectional areas which decrease in size in the axial direction of the inner electrode so as to form the deceleration electric field in the interior of the inner electrode.

18. An apparatus according to claim 16, wherein the openings in the inner electrode have respective areas which vary in the axial direction of the inner electrode so as to form the deceleration electric field in the interior of the inner electrode.

19. An apparatus comprising:
focusing means for focusing secondary ions, the focusing means comprising:
a plurality of cylindrical electrodes disposed coaxially with each other, an innermost one of the electrodes having openings distributed in an axial direction of the innermost electrode, the secondary ions being directed into an interior of the innermost electrode in the axial direction thereof; and
means for generating an electric field outside the innermost electrode;
wherein the electric field penetrates through the openings in the innermost electrode into the interior of the innermost electrode so as to focus the secondary ions therein in the axial direction of the innermost electrode.

20. An apparatus according to claim 19, further comprising means for applying a radio frequency voltage to an outer one of the electrodes so as to accelerate the secondary ions in the interior of the inner electrode.

21. A focusing lens comprising:
a plurality of cylindrical electrodes disposed coaxially with each other, an innermost one of the electrodes having openings distributed in an axial direction of the innermost electrode; and
means for generating an electric field outside the innermost electrode;
wherein the electric field penetrates through the openings in the innermost electrode into the interior of the innermost electrode so as to form a focusing lens therein.

22. A focusing lens according to claim 21, wherein the openings in the innermost electrode comprise pairs of openings, the openings of each pair being symmetrically disposed with respect to an axis of the innermost electrode.

23. A focusing lens according to claim 21, wherein the openings in the innermost electrode comprise first pairs of openings and second pairs of openings, each of the first pairs of openings being succeeded in the axial direction of the innermost electrode by an associated second pair of openings, wherein the openings of each pair are displaced by 180° from each other in a circumferential direction of the innermost electrode and are displaced by 90° in the circumferential direction from the openings of an associated preceding pair.

24. A device comprising:
a focusing lens composed of two cylindrical electrodes disposed coaxially with each other, the inner electrode having a plurality of openings in the peripheral direction as well in the axial direction, which produces an electric field penetrating within the inner electrode through said openings and decelerating ions in the axial direction;
wherein the decelerating electric field is produced by decreasing the diameter of said cylinders with increasing distance measured from the entrance for ions.

* * * * *